United States Patent [19]
Qureshi

[11] Patent Number: 5,774,475
[45] Date of Patent: Jun. 30, 1998

[54] TESTING SCHEME THAT RE-USES ORIGINAL STIMULUS FOR TESTING CIRCUITRY EMBEDDED WITHIN A LARGER CIRCUIT

[75] Inventor: Fazal Ur Rehman Qureshi, Cupertino, Calif.

[73] Assignee: National Semiconductor Corporation, Santa Clara, Calif.

[21] Appl. No.: 760,979

[22] Filed: Dec. 5, 1996

[51] Int. Cl.[6] .................................................. G01R 31/28
[52] U.S. Cl. ...................................... 371/22.31; 327/202
[58] Field of Search .............................. 371/22.31, 22.32, 371/22.5, 25.1, 27.5; 395/183.06; 364/489; 324/73.1, 765, 763; 327/202; 326/16, 38

[56] References Cited

U.S. PATENT DOCUMENTS

| | | | |
|---|---|---|---|
| 4,873,456 | 10/1989 | Olisar et al. | 307/272.1 |
| 5,115,435 | 5/1992 | Langford et al. | 371/22.3 |
| 5,172,011 | 12/1992 | Leuthold et al. | 307/272.2 |
| 5,172,397 | 12/1992 | Llewellyn | 375/110 |
| 5,210,759 | 5/1993 | DeWitt et al. | 371/22.3 |
| 5,347,523 | 9/1994 | Khatri eal. | 371/22.3 |
| 5,390,190 | 2/1995 | Nanda et al. | 371/22.3 |
| 5,418,481 | 5/1995 | Sikkink et al. | 327/20 |
| 5,477,545 | 12/1995 | Huang | 371/22.3 |
| 5,537,062 | 7/1996 | Mote, Jr. | 326/93 |
| 5,574,731 | 11/1996 | Qureshi | 371/22.3 |
| 5,587,672 | 12/1996 | Ranganathan et al. | 326/93 |
| 5,594,367 | 1/1997 | Trimberger et al. | 326/41 |
| 5,606,565 | 2/1997 | Edler et al. | 371/22.3 |
| 5,619,157 | 4/1997 | Kumata et al. | 327/203 |
| 5,633,606 | 5/1997 | Gaudet et al. | 327/202 |
| 5,646,567 | 7/1997 | Felix | 327/202 |

FOREIGN PATENT DOCUMENTS

| | | | |
|---|---|---|---|
| 63-48014 | 2/1988 | Japan | H03K 23/54 |
| 1-268220 | 10/1989 | Japan | H03K 5/01 |
| 3-1608 | 1/1991 | Japan | H03K 3/037 |
| 3-26610 | 1/1991 | Japan | H03K 5/01 |
| 3-34617 | 2/1991 | Japan | H03K 3/02 |
| 1325-677 | 7/1987 | U.S.S.R. | H03K 5/135 |

OTHER PUBLICATIONS

Fazal Ur Rehman Qureshi, "Declaration of Fazal Ur Rehman Qureshi" (regarding U.S. Pat. application No. 08/760,979), dated Nov. 18, 1997, pp. 1–3 and Exhibits A and B.

(List continued on next page.)

*Primary Examiner*—Robert W. Beausoliel, Jr.
*Assistant Examiner*—Nadeem Iqbal
*Attorney, Agent, or Firm*—Limbach & Limbach L.L.P.

[57] ABSTRACT

A testing circuit for use in testing X number of portions of circuitry embedded within a larger circuit. The testing circuit includes Y number of scan flip-flops which each have a normal data input, a scan data input, a data select input, a clock input and a data output. The scan flip-flops are serially coupled together such that the scan data input of a first flip-flop forms a serial data input for the testing circuit, the data output of a last flip-flop forms a serial data output for the testing circuit, the scan data input of each remaining flip-flop is connected to the data output of a previous flip-flop, the normal data input of at least one of the scan flip-flops forms an unload bus, and the data select signal of at least one of the scan flip-flops forms a test enable signal which enables one of the serial data input and the unload bus. Also included are Y number of latches which each have a data input, a clock input and a data output. Each of the latches has its data input and its clock input connected to the data output and the data select input, respectively, of a different one of the scan flip-flops. The data output of at least one of the latches forms a load bus. A set of X number of input multiplexers each have an input coupled to the load bus and an output coupled to a different one of the X number of portions of circuitry. An output multiplexer has an output and X number of inputs. The output is coupled to the unload bus and each of the inputs are coupled to a different one of the X number of portions of circuitry.

18 Claims, 8 Drawing Sheets

OTHER PUBLICATIONS

National Semiconductor, Amplifier Applications, "LMC6980/84/88 Fuel Gauge & Charge Control Solution", date unknown, pp. 1–66 thru 1–71.

National Semiconductor, "Intelligent Batteries Provide Updated Status Information, Longer Battery Life", date unknown, pp. 1–3, internet address: http://www.national.com/appinfo/lowpowervolt/brochure/8_9.html.

Hill and Peterson, "Digital Logic and Microprocssors", John Wiley & Sons, 1984, pp. 491–493.

Masakazu Shoji, "CMOS Digital Circuit Technology", Prentice Hall, 1988, pp. 299–307.

Gibson and Liu, "Microcomputers for Engineers and Scientists", Prentice–Hall, Inc., 1987, pp. 103–109.

Harold S. Stone, "Microcomputer Interfacing", Addison–Wesley, 1982, pp. 88–100.

| SCAN DATA IS INPUT INTO DEVICE: | SELECT INPUT BUS [1:0] 66 | DEVICE FROM WHICH DATA IS UNLOADED: | SELECT OUTPUT BUS [1:0] 64 |
|---|---|---|---|
| A | 00 | A | 00 |
| A | 00 | B | 01 |
| A | 00 | C | 10 |
| B | 01 | A | 00 |
| B | 01 | B | 01 |
| B | 01 | C | 10 |
| C | 10 | A | 00 |
| C | 10 | B | 01 |
| C | 10 | C | 10 |

TESTING SCHEME THAT RE-USES ORIGINAL STIMULUS FOR TESTING CIRCUITRY EMBEDDED WITHIN A LARGER CIRCUIT

BACKGROUND OF THE INVENTION

1. Field of the Invention

The present invention relates generally to the testing of integrated circuits, and, in particular, to a method and apparatus which simplifies testing by re-using existing stimulus/response for circuitry that may be embedded in a larger device.

2. Description of the Related Art

After the manufacturing process of an integrated circuit device is complete, it is normally necessary to test the circuit. It is well known that the testing of an integrated circuit has become a significant part of its total cost. Techniques which can simplify such testing can help to reduce manufacturing costs.

Figure 1:
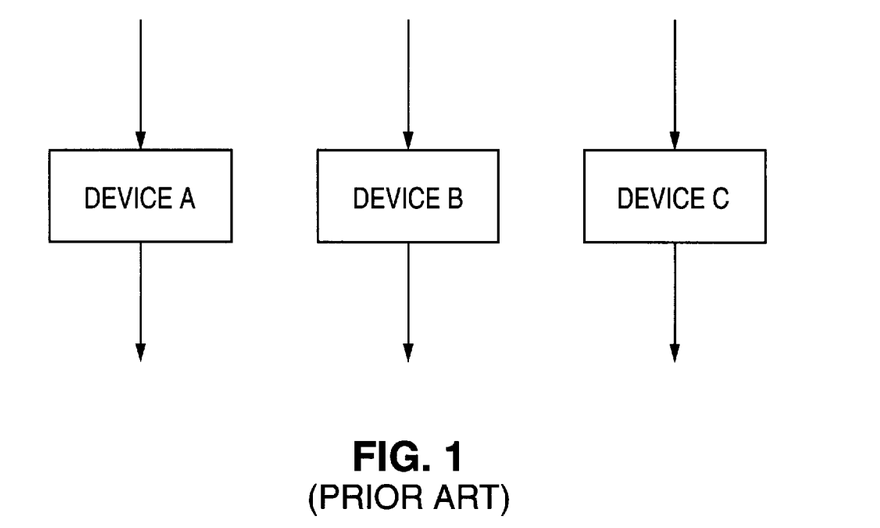
FIG. 1 is a block diagram illustrating three conventional stand alone integrated circuit devices.

Referring to FIG. 1, if devices A, B and C are isolated circuit components, i.e., their inputs and outputs are accessible, they can easily be tested by providing a set of inputs and verifying that the correct output data is generated. However, there is a rapid movement towards customization of circuitry in terms of creating new and/or different capabilities out of existing devices, e.g., megacell mix and match approach. For example, referring to FIG. 2, devices A, B and C can be interconnected to form a single new device 20. In this scenario, functionality relating to devices A, B and C can become "buried" such that direct access to their inputs and/or outputs is either very difficult or not possible. This makes testing of the functionality related to devices A, B and C difficult.

Figure 2:
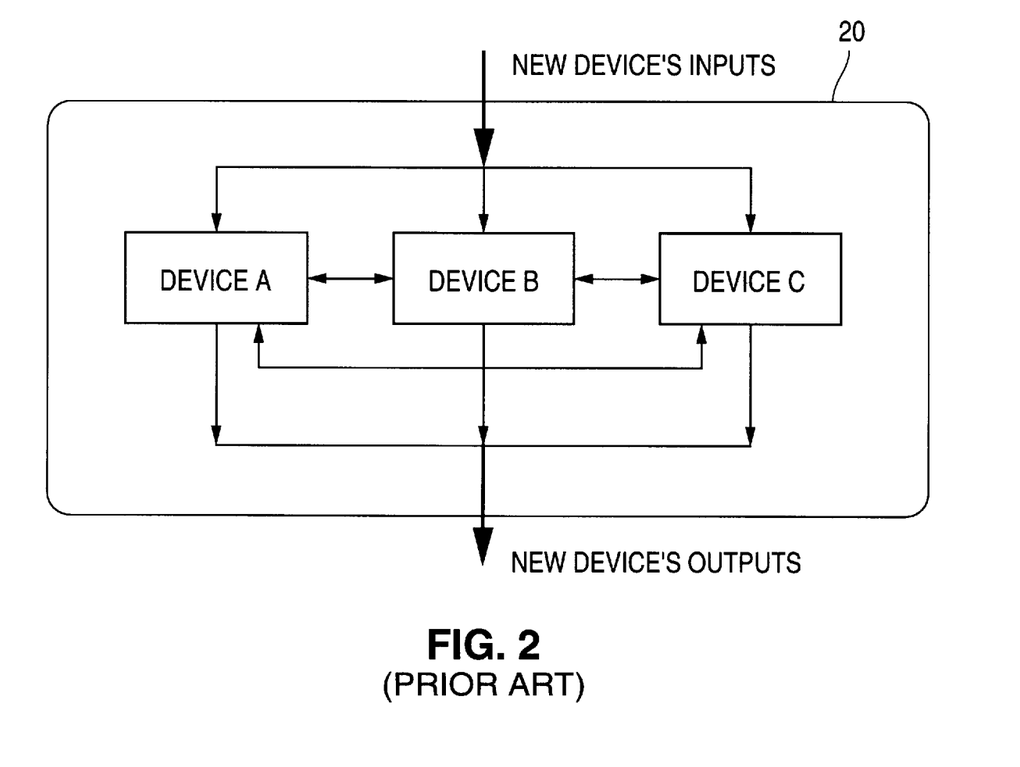
FIG. 2 is a block diagram illustrating a conventional integrated circuit device which is constructed from the three devices shown in FIG. 1.

In the scenario where devices A, B and C are isolated circuit components, a significant amount of time and effort is typically spent creating testing stimulus and response that is specifically designed for testing each individual device. Once devices A, B and C are buried in the new device 20, however, the stimulus and response which was used for testing the individual devices is generally not re-useable because the inputs and outputs of each device are no longer accessible.

There have been previous attempts to develop schemes for simplifying the testing of individual devices embedded in a larger device. Such schemes, however, have tended to be very restrictive. For example, one such scheme involved multiplexing input/output pins for all buried functions. One problem with this scheme, however, is that there may not be enough I/O pins for all of the buried functions. Another scheme involved surrounding the embedded functions with a "collar", i.e., a mini-scan chain arrangement, and then testing the buried functions individually. However, this scheme would be prohibitively expensive in terms of both control and silicon overhead and is thus not very practical.

Thus, there is a need for a method and/or apparatus which simplifies the testing of individual devices or portions of circuitry embedded in a larger device, such as the new device 20, and which permits previously developed testing stimulus and response to be reused.

SUMMARY OF THE INVENTION

The present invention provides a testing circuit for use in testing X number of portions of circuitry embedded within a larger circuit. The testing circuit includes a serial to parallel data chain having a serial data input, a serial data output, a parallel load bus for loading test data into one of the portions of circuitry, a parallel unload bus for unloading test data from one of the portions of circuitry, and a test enable signal which enables one of the serial data input and the parallel unload bus. A set of X number of input multiplexers each have an input coupled to the load bus and an output coupled to a different one of the X number of portions of circuitry. An output multiplexer having an output and X number of inputs has its output coupled to the unload bus and each of the inputs coupled to a different one of the X number of portions of circuitry.

The present invention also provides a testing circuit for use in testing a portion of circuitry embedded within a larger circuit. The testing circuit includes a plurality of scan flip-flops which each have a normal data input, a scan data input, a data select input, a clock input and a data output. The scan flip-flops are serially coupled together such that the scan data input of a first flip-flop forms a serial data input for the testing circuit, the data output of a last flip-flop forms a serial data output for the testing circuit, and the scan data input of each remaining flip-flop is connected to the data output of a previous flip-flop. A plurality of latches which each have a data input, a clock input and a data output each have their data input and clock input connected to the data output and the data select input, respectively, of a different one of the scan flip-flops. The data output of at least one of the latches forms a load bus for loading test data into the portion of circuitry, the normal data input of at least one of the scan flip-flops forms an unload bus for unloading test data from the portion of circuitry, and the data select signal of at least one of the scan flip-flops forms a test enable signal which enables one of the serial data input and the unload bus.

The present invention also provides a method of testing X number of portions of circuitry embedded within a larger circuit. The method includes the steps of: serially loading test data into a plurality of serially connected scan flip-flops; latching a data output of each of the scan flip-flops; loading the latched data in a parallel manner into one of an X number of input multiplexers which are each associated with one of the portions of circuitry; loading output data from each of the portions of circuitry in a parallel manner into a different one of an X number of inputs of an output multiplexer; and loading data from an output of the output multiplexer into the plurality of serially connected scan flip-flops in a parallel manner.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 3:
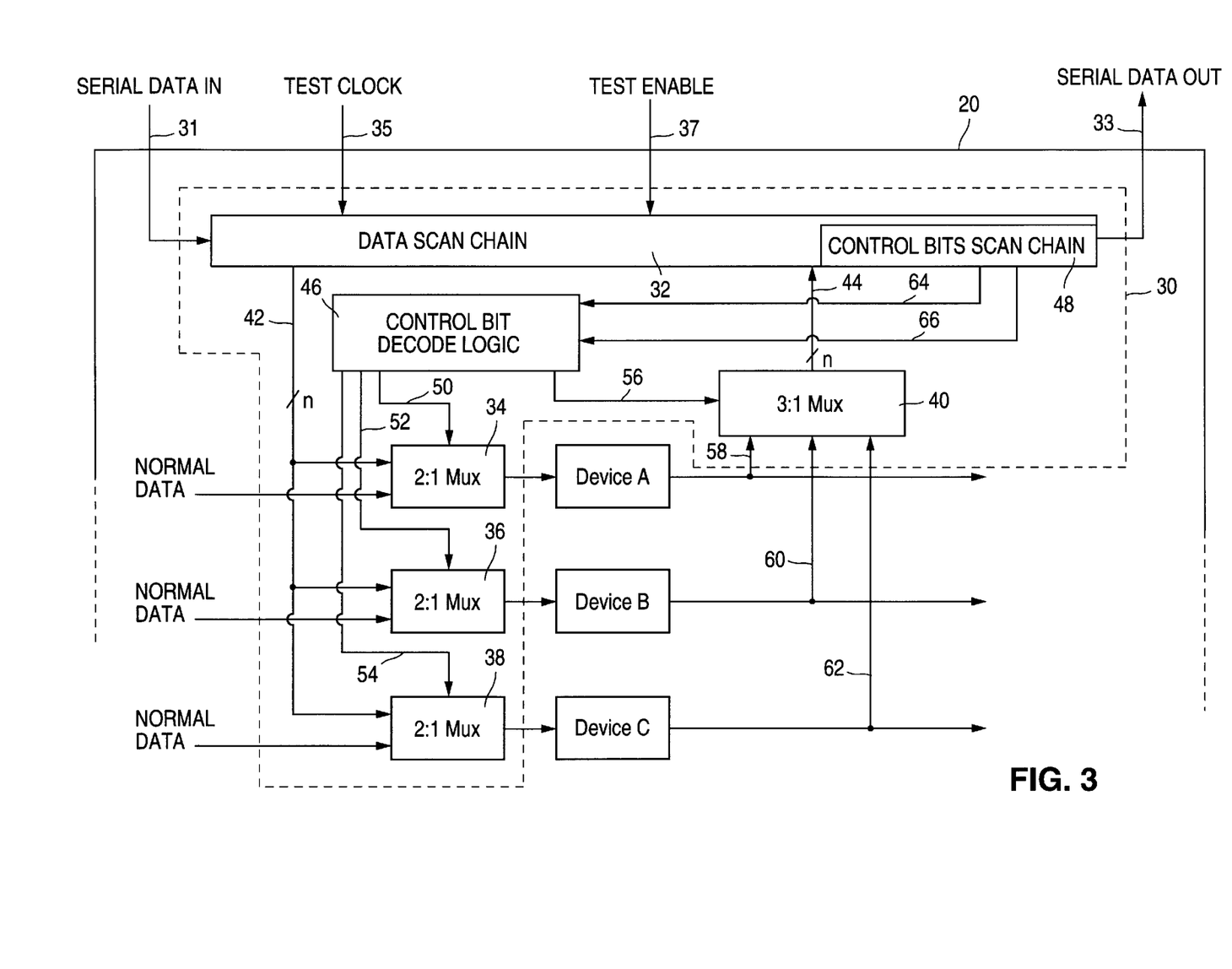
FIG. 3 is a block diagram illustrating a testing system in accordance with the present invention.

Referring to FIG. 3, there is illustrated a testing system 30 in accordance with the present invention. The testing system 30 is shown incorporated into the larger integrated circuit device 20 and allows one to have access to the internal functions, i.e., devices A, B, C, in a uniform, independent and cost effective manner, thus reducing time to market requirements for test development. In other words, the system 30 is a feature which can be included in an integrated circuit, such as the larger device 20, in order to simplify the integrated circuit's own testing. The system 30 provides the ability to "isolate" devices A, B, C as though they are stand alone single devices. This allows available testing stimulus to be reused.

Although the testing system 30 shown in FIG. 3 is configured for testing the three devices A, B, C, it should be well understood that the testing system 30 could be configured for testing any number of devices, i.e., functions or portions of circuitry, which are embedded within the device 20, in accordance with the present invention. The testing system 30 is a four pin solution, i.e., it utilizes four pins on the device 20: a serial data input 31, a serial data output 33, a test clock input 35 and a test enable signal 37. The cost of implementation of the system 30 can be reduced by sharing pins. For example, rather than having dedicated serial data input and output pins 31, 33, these functions could share pins for other functions of the device 20.

The testing system 30 includes a data scan chain 32, a set of input multiplexers 34, 36, 38, and an output multiplexer 40. The data scan chain 32 acts as a "pseudo pins" arrangement for devices A, B, C, providing input testing stimulus to them and capturing output responses from them. The data scan chain 32 is connected to the serial data input 31, the serial data output 33, the test clock 35 and the test enable signal 37, and in addition, includes a parallel load bus 42 and a parallel unload bus 44. The test enable signal 37 enables the serial data input 31 and disables the parallel unload bus 44 in one state, and disables the serial data input 31 and enables the parallel unload bus 44 in another state.

During operation, the serial data input 31 is enabled so that test stimulus (or test data) can be serially loaded into the data scan chain 32. The serial loading of the test data is controlled by the test clock 35. After the test data is loaded into the data scan chain 32, the state of the test enable signal 37 is changed to enable the parallel load and unload busses 42, 44. The parallel load bus 42 is used for loading test data into one of the devices A, B, C via its respective input multiplexer 34, 36, 38. The parallel unload bus 44 is used for unloading test data from one of the devices A, B, C via the output multiplexer 40. It has been assumed for the present discussion that the devices A, B and C each have an equal number of input and output bits, i.e., the parallel load and unload busses 42, 44 are each n bits wide. However, it should be understood that one or more of the devices A, B and C may have a different number of input bits than output bits, and thus, the parallel load and unload busses 42, 44 may not have the same width. Furthermore, it is envisioned that the output multiplexer 40 could be replaced with a bus.

There will ordinarily be one multiplexer associated with each device, i.e., portion of circuitry, which is to be tested. Thus, because in FIG. 3 there are three devices A, B, C to be tested, there are three input multiplexers 34, 36, 38. It should be understood, however, that there may be more or fewer than three devices which can be tested, and thus, more or fewer than three multiplexers. Furthermore, some of the input or output pins for one or more of the embedded devices A, B, C may actually be connected to the external pins of the device 20, and thus accessible. For example, the inputs of device A may be connected to the external pins of the device 20, but the outputs of device A may be embedded. In this scenario a multiplexer may not be needed for the inputs of device A but will be needed for the outputs.

The input multiplexers 34, 36, 38 are 2:1 multiplexers. One of their inputs is connected to the load bus 42, and the other input of each multiplexer 34, 36, 38 is connected to the data lines which would normally be connected to the devices A, B, C. The output of each of the input multiplexers 34, 36, 38 is connected to its respective device A, B, C.

The output multiplexer 40 will normally have one input for each device or portion of circuitry being tested. Thus, the output multiplexer 40 is a 3:1 multiplexer having three inputs 58, 60, 62 which correspond to the devices A, B, C, respectively. However, it should be understood that if there were more or fewer devices to be tested, then the output multiplexer 40 would have more or fewer inputs. The output of the output multiplexer 40 is coupled to the parallel unload bus 44.

Because one purpose of the present invention is to isolate and test a single device, only one of the devices A, B, C will normally receive the test data from the parallel load bus 42. Thus, a control circuit 46 is used to select the particular input multiplexer 34, 36, 38 which will receive data from the parallel load bus 42 rather than its normal data path. The two input multiplexers 34, 36, 38 which are non-selected will continue to receive their normal data as inputs. The input multiplexers 34, 36, 38 will have their inputs switched from normal data to the parallel load bus 42 via lines 50, 52, 54, respectively.

Similarly, the control circuit 46 will also select one of the inputs 58, 60, 62 of the output multiplexer 40 to provide data to the parallel unload bus 44. The output multiplexer 40 receives this information from the control circuit 46 via line 56. Depending on which input 58, 60, 62 is selected, output data from one of the devices A, B, C will be placed on the parallel unload bus 44. It will often be the case that output data from the same device A, B, C to which data is input via one of the input multiplexers 34, 36, 38 will be selected. However, it should be well understood that output data from a different device A, B, C than to which input data is sent may be selected. For example, the input multiplexer 34 may be selected so that device A receives test data from the parallel load bus 42, but at the same time, the input 62 of the output multiplexer 40 may be selected so that the output of device C is placed on the unload bus 44. This type of testing, e.g., sending testing data to device A and taking results from device C, is advantageous for testing "intra function" connectivity, i.e., interconnections between the devices A, B, C.

The control circuit 46 is basically a decode logic circuit which decodes control bits received from a control bits scan chain 48, which is part of the data scan chain 32. The control bits scan chain 48 includes a select output bus 64 and a select input bus 66. The select output bus 64 provides information to the control circuit 46 for selecting which input 58, 60, 62 of the output multiplexer 40 will be active. Similarly, the select input bus 66 provides information to the control circuit 46 for selecting which of the input multiplexers 34, 36, 38 will pass information from the parallel load bus 42 to its respective device A, B, C. The data included in the control bits scan chain 48 is loaded serially, along with the test data included in the rest of the data scan chain 32, through the serial data input 31.

To summarize the basic operation of the testing system 30, the test enable signal 37 is set so that the serial data input 31 is active. Test data is serially loaded through the serial data input 31 into the data scan chain 32. The first portion of the test data is stored in the control bits scan chain 48; this data determines which one of the devices A, B, C to which the test data will be sent and which one of the devices A, B, C the results will be taken from. The control circuit 46 decodes the data received over lines 64, 66, and in response thereto, selects one of the multiplexers 34, 36, 38 to receive data from the parallel load bus 42 and activates one of the inputs 58, 60, 62 of the output multiplexer 40.

Next, the state of the test enable signal 37 is changed so that the serial data input 31 is disabled and the parallel load bus 42 is enabled. The test data is loaded in a parallel manner into the selected one of the multiplexers 34, 36, 38 via the parallel load bus 42. The selected one of the multiplexers 34, 36, 38 transfers the test data, in a parallel manner, into its respective device A, B, C. The test data is processed by the selected device A, B, C, and then the output multiplexer 40 receives, in a parallel manner, the results from the device A, B, C which corresponds to the selected one of the inputs 58, 60, 62 of the output multiplexer 40. The results are loaded in a parallel manner into the data scan chain 32 via the unload bus 44.

The state of the test enable signal 37 is then changed again so that the serial data input 31 and serial data output 33 are enabled and the parallel load bus 42 is disabled. As new test data is shifted into the serial data input 31, the results from the previous test data are shifted out of the serial data output 33. This completes one testing cycle.

Figure 4:
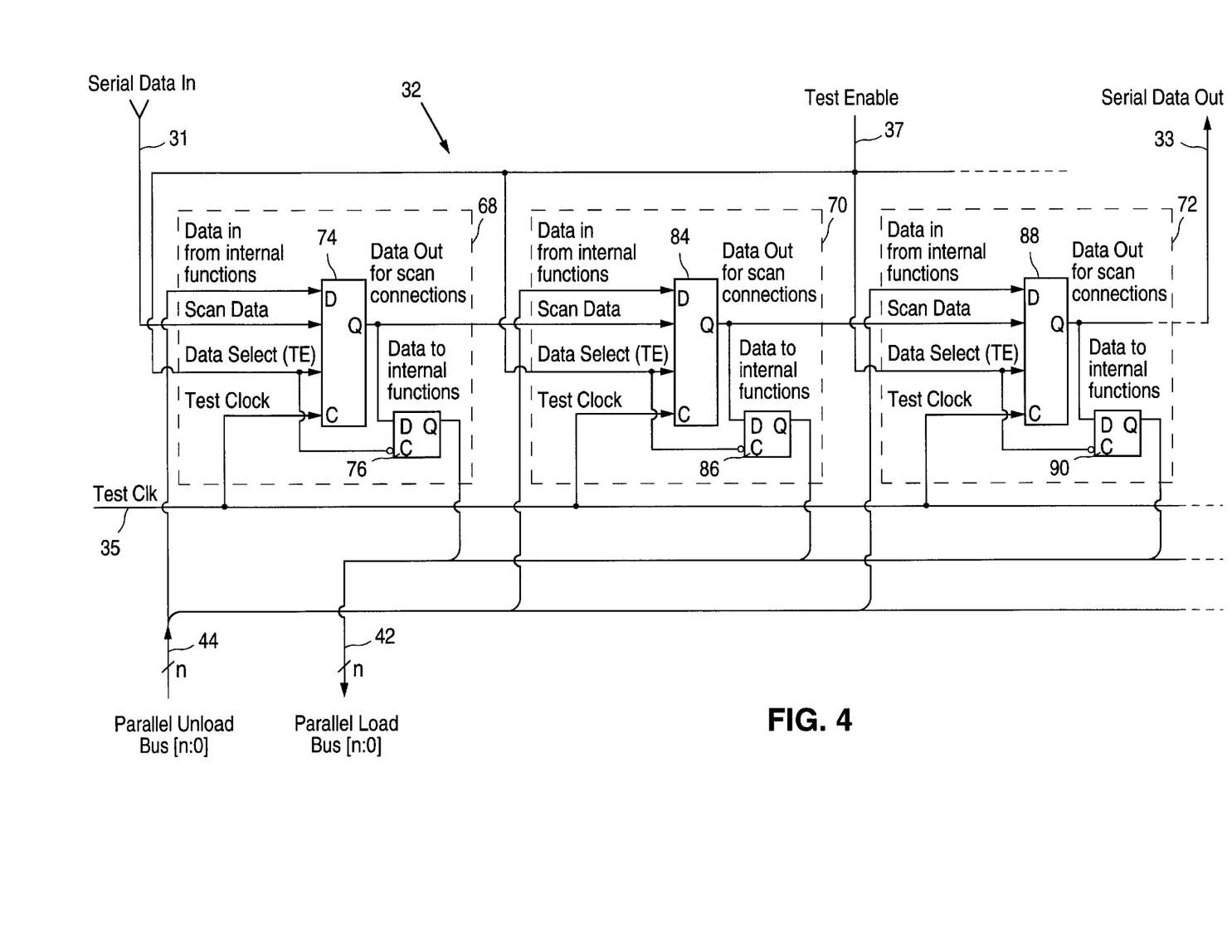
FIG. 4 is a schematic diagram illustrating the data scan chain shown in FIG. 3.
Figure 5:
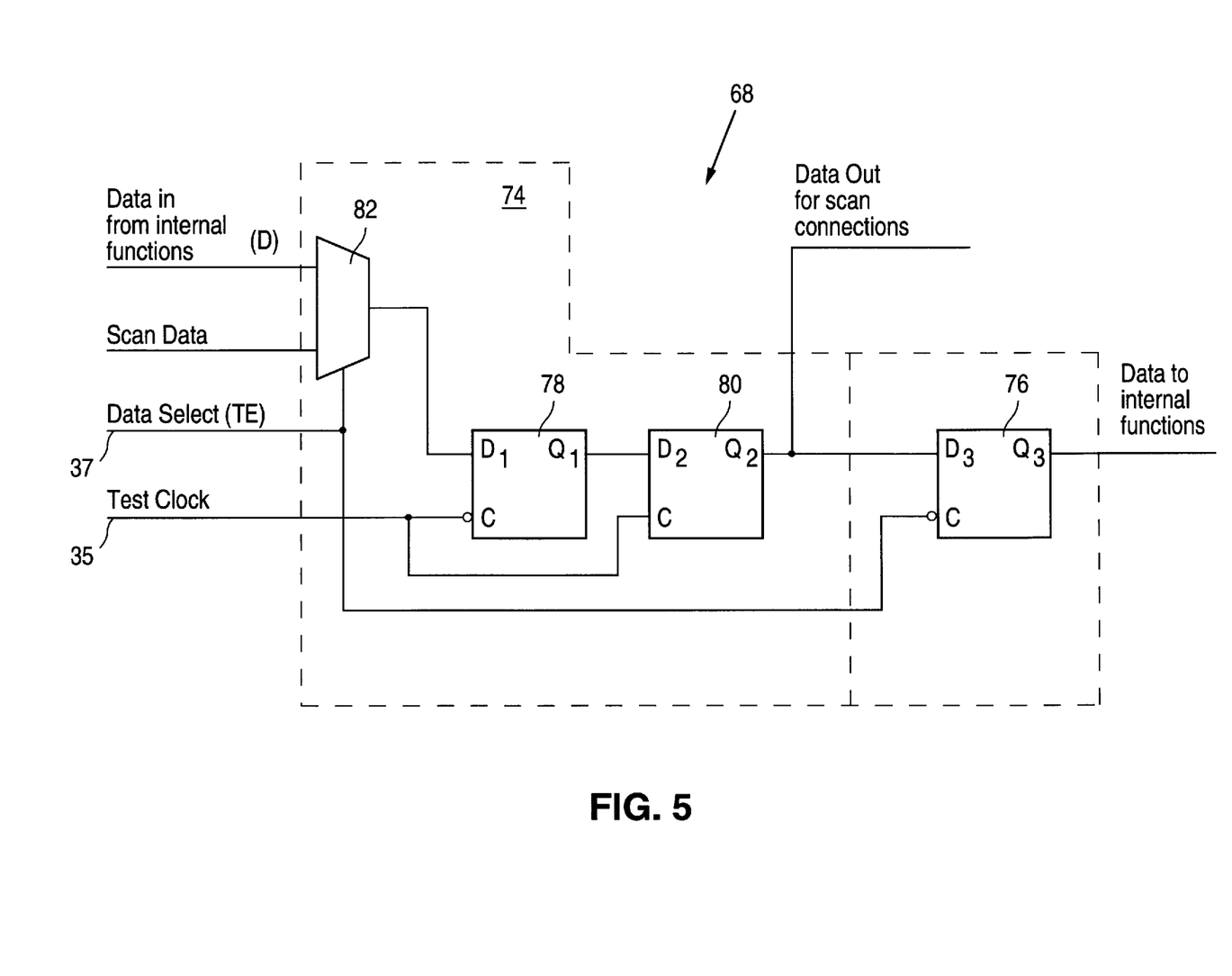
FIG. 5 is a schematic diagram illustrating one of the flip-flop cells shown in FIG. 4.

Referring to FIG. 4, the data scan chain 32 is constructed from several serial connected flip-flop cells 68, 70, 72. The length of the data scan chain 32, i.e., the number of flip-flop cells included therein, is normally equal to the sum of the largest number of inputs or outputs included in one of the devices to be tested and the number of control bits (discussed below) that are needed for selecting the input and output devices. The number of flip-flop cells determines the width of the parallel load and unload busses 42, 44. A detailed schematic of one of the flip-flop cells 68 is shown in FIG. 5. The flip-flop cell 68 includes a conventional "scan" flip-flop 74 and a latch 76 connected thereto. A "scan" flip-flop is a flip-flop which includes a second "scan data" input, multiplexed with the normal D input, which allows the flip-flop to operate as a shift register.

The scan flip-flop 74 includes two latches 78, 80 and a multiplexer 82. The multiplexer 82 has two inputs and an output coupled to the latch 78. One of the inputs of the multiplexer 82 serves as the D input and the other input serves as the scan data input. A data select input (TE) is used to select either the D input or the scan data input to route data through the multiplexer 82 to the data input of latch 78. The test clock 35 is connected to the inverting clock input of latch 78 and the non-inverting clock input of latch 80. The data input of latch 76 is connected to the data output of latch 80, and the inverting clock input of latch 76 is connected to the data select input of the scan flip-flop 74. Thus, the data output of latch 76 is updated only when the data select input of the scan flip-flop 74 changes state.

The flip-flop cells 68, 70, 72 are serially coupled together. The scan data input of the first scan flip-flop 74 serves as the serial data input 31, and the data output of the last scan flip-flop 88 serves as the serial data output 33. The scan data inputs of each of the scan flip-flops 84, 88 are connected to the data output of the previous scan flip-flops 74, 84, respectively, in the chain. The data select of each of the scan flip-flops 74, 84, 88 are coupled together to form the test enable signal 37, and the clock input of each of the scan flip-flops 74, 84, 88 are coupled together and to the test clock 35. The D input of each of the scan flip-flops 74, 84, 88 are collected together to form the parallel unload bus 44, and the data output of each of the latches 76, 86, 90 are collected together to form the parallel load bus 42. Again, the number of flip-flop cells which are used, e.g. flip-flop cells 68, 70, 72, determines the width n of the parallel load and unload busses 42, 44. The specific width n which is used may vary widely depending on the particular application.

Figure 6:
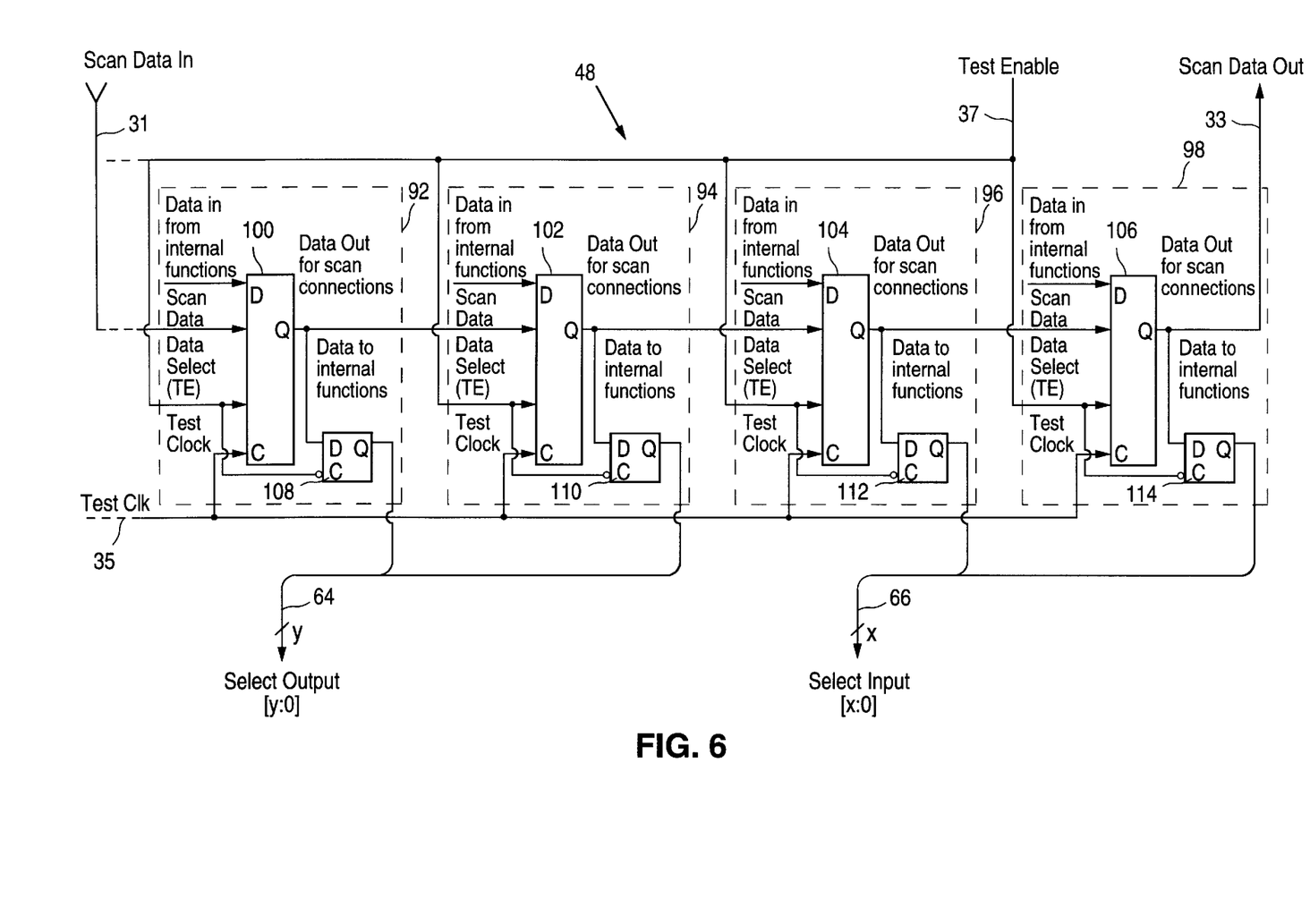
FIG. 6 is a schematic diagram illustrating the control bits scan chain shown in FIG. 3.

A detailed schematic of the control bits scan chain 48 is shown in FIG. 6. The control bits scan chain 48 includes several serially connected flip-flop cells 92, 94, 96, 98 and is basically a part of the data scan chain 32. The flip-flop cells 92, 94, 96, 98 are connected together in the same manner as the flip-flop cells 68, 70, 72, except that the D input of each of the scan flip-flops 100, 102, 104, 106 is left unconnected. This is because control data is generally loaded from the control bits scan chain 48 into the control circuit 46, but control data is normally not loaded back into the control bits scan chain 48. There are at least three possibilities as to what can be connected to the D inputs of scan flip-flops 100, 102, 104, 106. The first is that bits from the parallel unload bus 44 could be connected, thus saving a few flip-flops. The second possibility is that the select input, i.e., bits forming bus 66, and the select output, i.e., bits forming bus 64, could be tied back to their respective D inputs. The third possibility is that the scan flip-flops 100, 102, 104, 106 could be replaced with normal flip-flops which have only a D input and no scan data input. In this scenario, the connections which are currently made to the scan data input would instead be made to the D input. This last solution will save some silicon.

As discussed above, the select output bus 64 provides information to the control circuit 46 for selecting which input 58, 60, 62 of the output multiplexer will be active, and the select input bus 66 provides information to the control circuit 46 for selecting the specific input multiplexer 34, 36, 38. The data output of latches 108, 110 are collected together to form the select output bus 64, and the data output of latches 112, 114 are collected together to form the select input bus 66. Although the select output and input busses 64, 66 shown in FIG. 6 are each two bits wide, it should be well understood that they may have greater or smaller bit widths, and the busses 64, 66 do not have to have the same bit width.

Figure 7:
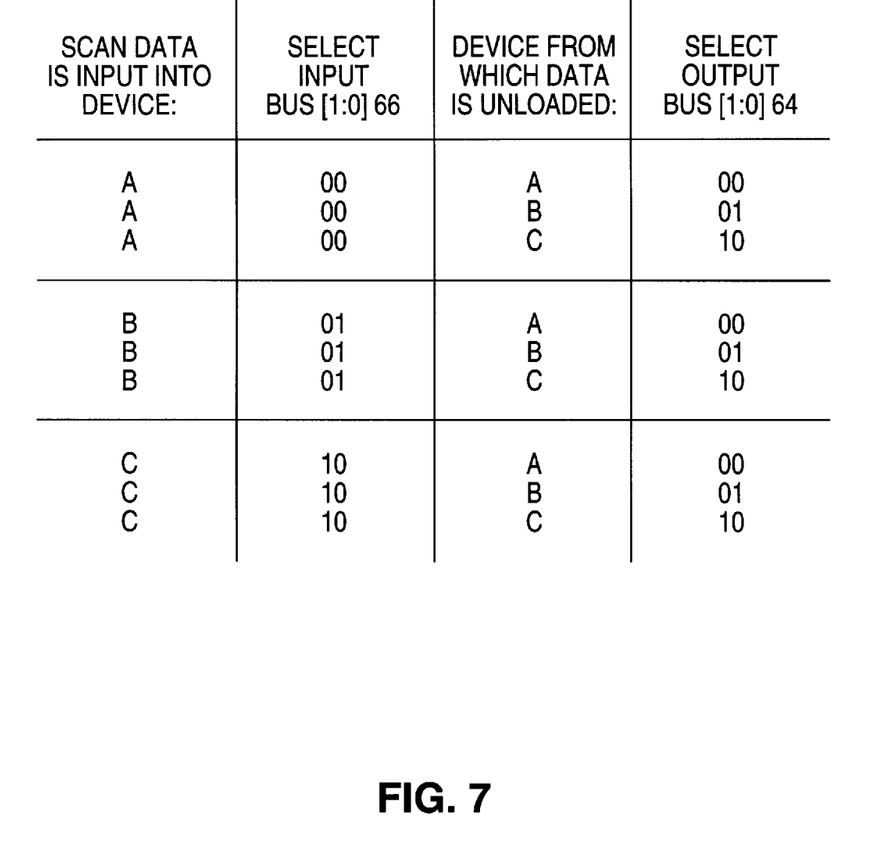
FIG. 7 is a table illustrating the operation of the control circuit shown in FIG. 3.

The control circuit 46 is a decode circuit which decodes the bits provided by the select output and input busses 64, 66. For example, the table shown in FIG. 7 illustrates one way that the decoding may be performed. Specifically, if the select input bus 66 is equal to 00, multiplexer 34 will be switched to route the test data from the parallel load bus 42 to device A; if the select input bus 66 is equal to 01, then the test data will be routed to device B; and if the select input bus 66 is equal to 10, then the test data will be routed to device C. Similarly, if the select output bus 64 is equal to 00, then input 58 of the output multiplexer 40 will be activated so that the results of device A are loaded onto the parallel unload bus 44; if the select output bus 64 is equal to 01, then the results of device B are loaded onto the parallel unload bus 44; and if the select output bus 64 is equal to 10, then the results of device C are loaded onto the parallel unload bus 44. The outputs 50, 52, 54 of the control circuit 46 cause each respective multiplexer 34, 36, 38 to switch between its two inputs. The output 56 of the control circuit 46 activates the selected one of the inputs 58, 60, 62 of the output multiplexer 40.

Figure 8A:
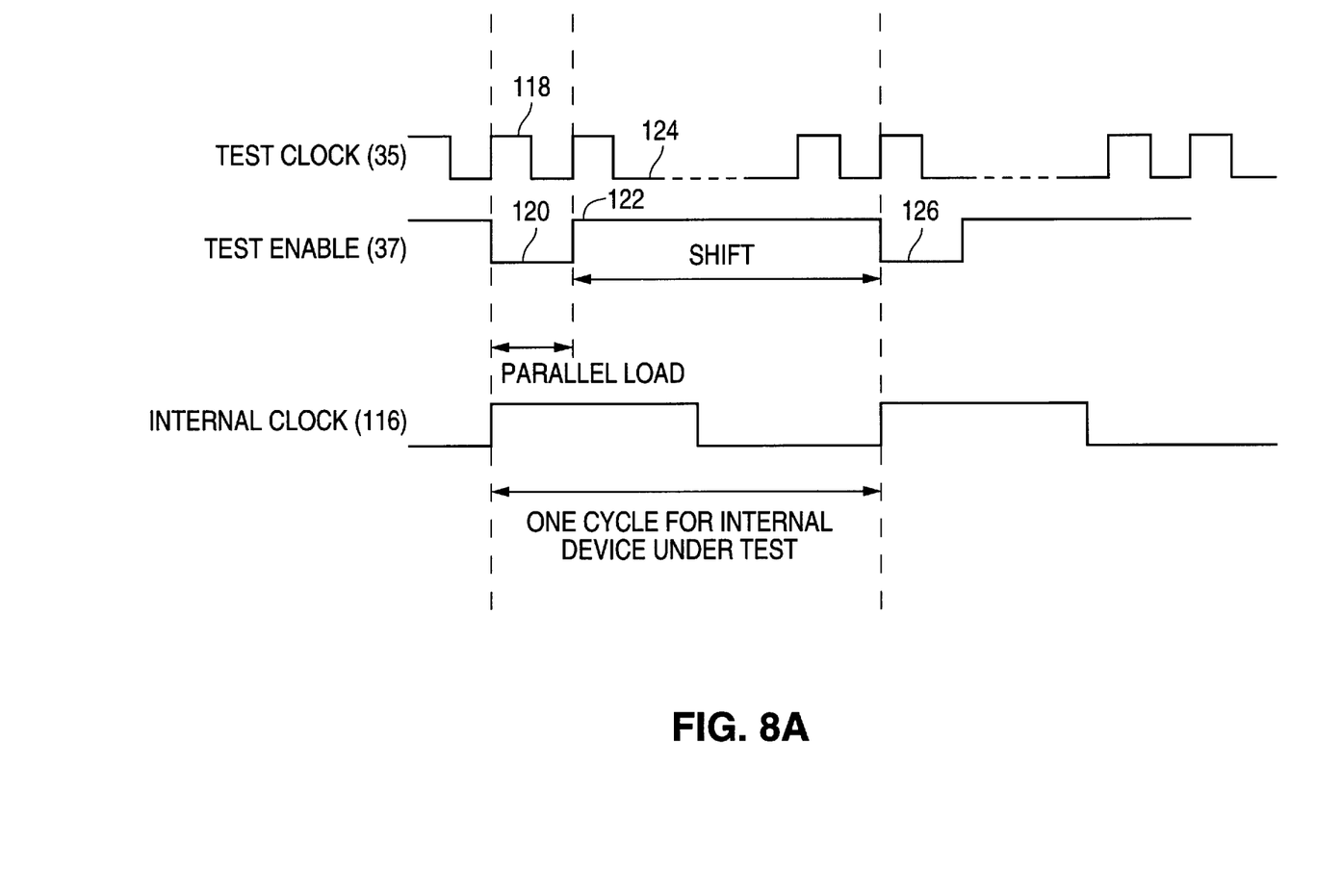
FIGS. 8A and 8B are timing diagrams illustrating the operation of the testing system shown in FIG. 3.

Referring to FIG. 8A, the internal devices A, B, C are run by an internal clock 116, i.e., the normal clock for the device 20. The test clock 35 operates at a higher frequency than the internal clock 116 so that the test data can be shifted into the data scan chain 32 and loaded into the device to be tested all within one cycle of the internal clock 116. This way, devices A, B, C are permitted to operate at their normal speed during testing. The frequency of the test clock 35 may or may not be related to the internal clock 116 frequency.

Specifically, during a first period 118 of the test clock 35 the test data bits and control bits that were previously shifted into the data scan chain 32 are captured by the attached latches 76, 86, 90, 108, 110, 112, 114. The test enable signal 37 is low which disables the scan data input of each of the scan flip-flops 74, 84, 88, 100, 102, 104, 106 and enables the normal D input of scan flip-flops 74, 84, 88, i.e., the parallel unload bus 44. A parallel load is then performed so that the test data bits from latches 76, 86, 90 are loaded into the selected one of the multiplexers 34, 36, 38 via the parallel load bus 42 and the control bits are loaded into the control circuit 46 via the select input and output busses 66, 64. At the same time, i.e., during the parallel load, output data from the selected one of the devices A, B, C is captured in the scan flip-flops 74, 84, 88 via the parallel unload bus 44. Thus, the output responses are loaded into the flip-flop cells in "parallel" with the new values being "set up". This way the flip-flop cells 68, 70, 72 contain both the results from the previous set of test data as well as the fresh test data.

After the first period 118 of the test clock 35 the test enable signal 37 goes high 122 which enables the scan data input of each of the scan flip-flops 74, 84, 88, 100, 102, 104, 106 and disables the normal D input of scan flip-flops 74, 84, 88. A new set of test data is then serially loaded into the data scan chain 32 via the serial data input 31 and the results from the previous set of test data are simultaneously shifted out of the serial data output 33. Although a new set of test data and control data is shifted into the scan flip-flops 74, 84, 88, 100, 102, 104, 106 and the previous set of results are shifted out, the previous test data and control data at the outputs of the latches 76, 86, 90, 108, 110, 112, 114 remains unchanged until the test enable signal 37 changes state. In other words, the previous test data and control data are kept steady, by loading them into the latches, while the next set of values are shifted into the flip-flop cells.

Shifting the new set of test data into the data scan chain 32 takes several cycles 124 of the test clock 35. Usually, the number of clock cycles 124 is equal to the total number of flip-flop cells 68, 70, 72, 92, 94, 96, 98 included in the data scan chain 32 and the control bits scan chain 48.

After the new set of test data has been shifted into the data scan chain 32, the test enabled signal 37 goes low 126 again for the next parallel load. When the test enabled signal 37 goes low 126, each of the latches 76, 86, 90 latches the data output of its respective scan flip-flop 74, 84, 88. The test data is then loaded in parallel into the selected one of the multiplexers 34, 36, 38 via the parallel load bus 42. Because the data scan chain 32 receives data in serial and applies it in parallel, it functions as a serial to parallel data chain.

Figure 8B:
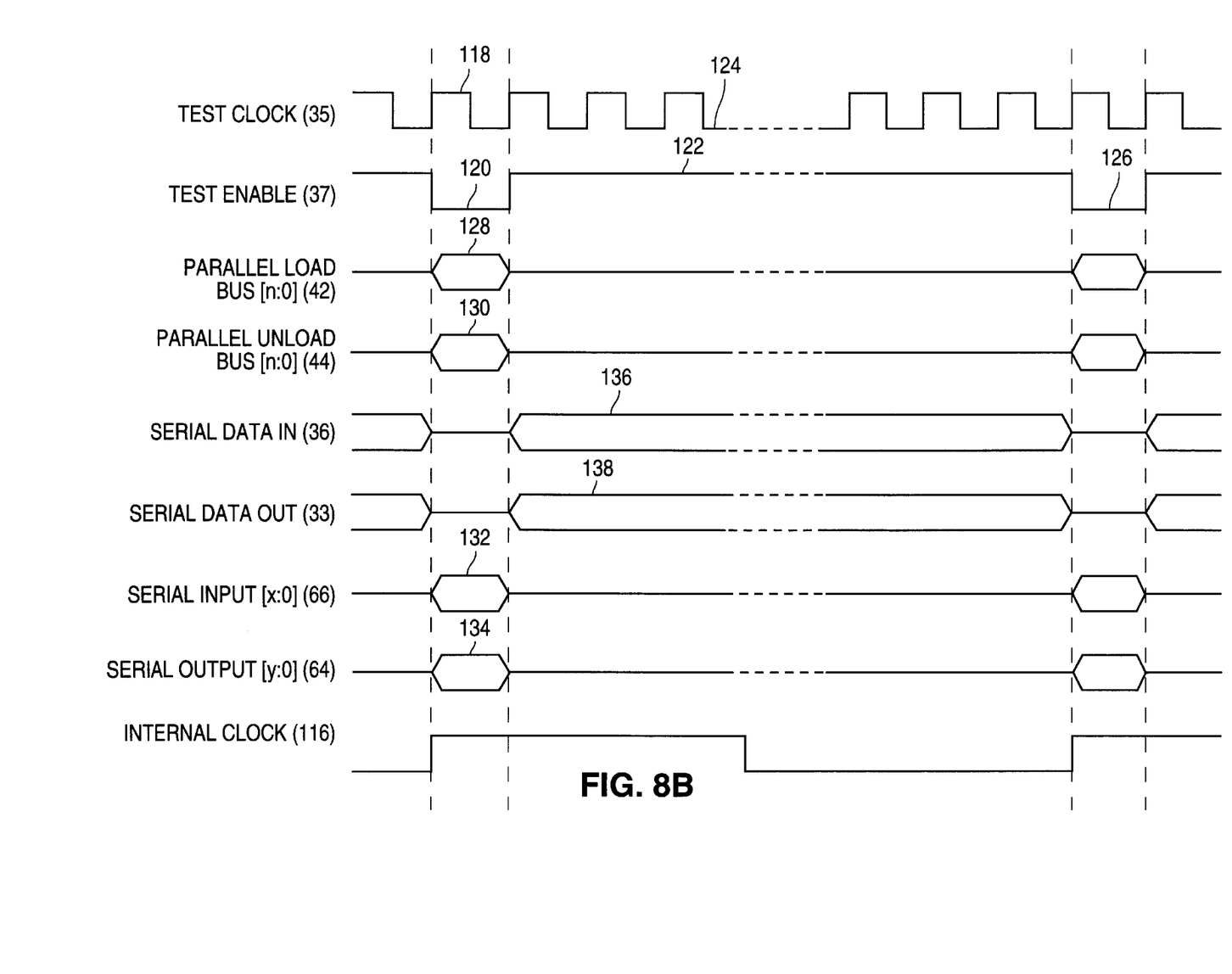

FIG. 8B more clearly illustrates that the parallel load and unload busses 42, 44 are active 128, 130 while the test enable signal 37 is low 120. Furthermore, the select input and output busses 66, 64 are also active 132, 134 during the same period. When the test enable signal 37 goes high 122, the serial data input and output 31, 33 then become active 136, 138. The parallel load and serial shift can be completed during one period of the internal clock 116 because the new test data is shifted in at the higher test clock 35 frequency.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A testing circuit for use in testing an X number of portions of circuitry embedded within a larger circuit, comprising:

a serial to parallel data chain having a serial data input, a serial data output, a parallel load output configured to load test data into one of the portions of circuitry, a parallel unload input configured to receive test data from one of the portions of circuitry, and a test enable signal which enables one of the serial data input and the parallel unload input;

an X number of input multiplexers which each have an input coupled to the parallel load output of the serial to parallel data chain and an output coupled to a different one of the X number of portions of circuitry; and an output multiplexer having an output and an X number of inputs, the output of the output multiplexer being coupled to the parallel unload input of the serial to parallel data chain and each of the inputs of the output multiplexer being coupled to a different one of the X number of portions of circuitry.

2. A testing circuit in accordance with claim 1, wherein the serial to parallel data chain comprises:

a plurality of scan flip-flops which each have a normal data input, a scan data input, a data select input, a clock input and a data output, the scan flip-flops being serially coupled together such that the scan data input of a first flip-flop forms the serial data input, the data output of a last flip-flop forms the serial data output, and the scan data input of each remaining flip-flop is connected to the data output of a previous flip-flop;

wherein the normal data input of at least one of the scan flip-flops forms the parallel unload input of the serial to parallel data chain and the data select signal of at least one of the scan flip-flops forms the test enable signal.

3. A testing circuit in accordance with claim 2, wherein the serial to parallel data chain further comprises:

a plurality of latches which each have a data input, a clock input and a data output, each of the latches having its data input and its clock input connected to the data output and the data select input, respectively, of a different one of the scan flip-flops;

wherein the data output of at least one of the latches forms the parallel load output of the serial to parallel data chain.

4. A testing circuit in accordance with claim 1, further comprising:

a control circuit which, in response to data received in the serial data input, selects one of the input multiplexers to receive data from the parallel load output of the serial to parallel data chain and which selects one of the inputs of the output multiplexer to provide data to the parallel unload input of the serial to parallel data chain.

5. A testing circuit in accordance with claim 4, wherein the serial to parallel data chain provides data to the control circuit.

6. A testing circuit for use in testing a portion of circuitry embedded within a larger circuit, comprising:
a plurality of scan flip-flops which each have a normal data input, a scan data input, a data select input, a clock input and a data output, the scan flip-flops being serially coupled together such that the scan data input of a first flip-flop forms a serial data input for the testing circuit, the data output of a last flip-flop forms a serial data output for the testing circuit, and the scan data input of each remaining flip-flop is connected to the data output of a previous flip-flop; and
a plurality of latches which each have a data input, a clock input and a data output, each of the latches having its data input and its clock input connected to the data output and the data select input, respectively, of a different one of the scan flip-flops;
wherein the data output of at least one of the latches forms a load output configured to load test data into the portion of circuitry, the normal data input of at least one of the scan flip-flops forms an unload input configured to receive test data from the portion of circuitry, and the data select signal of at least one of the scan flip-flops forms a test enable signal which enables one of the serial data input and the unload input.

7. A testing circuit in accordance with claim 6, further comprising:
an input multiplexer having an input coupled to the load output and an output coupled to the portion of circuitry.

8. A testing circuit in accordance with claim 6, wherein the testing circuit may be used for testing at least one other portion of circuitry embedded within the larger circuit, the testing circuit further comprising:
an input multiplexer associated with each portion of circuitry, each of the input multiplexers having an output which is coupled to a different one of the portions of circuitry and an input which is coupled to the load output; and
an output multiplexer having an output coupled to the unload input and a number of inputs such that each input is coupled to a different one of the portions of circuitry.

9. A testing circuit in accordance with claim 8, further comprising:
a control circuit which, in response to data received in the serial data input, selects one of the input multiplexers to receive data from the load output and which selects one of the inputs of the output multiplexer to provide data to the unload input.

10. A testing circuit in accordance with claim 9, wherein the data output of at least one of the latches is coupled to the control circuit to provide data for selecting one of the input multiplexers, and the data output of at least another one of the latches is coupled to the control circuit to provide data for selecting one of the inputs of the output multiplexer.

11. A testing circuit for use in testing an X number of portions of circuitry embedded within a larger circuit, comprising:
a Y number of scan flip-flops which each have a normal data input, a scan data input, a data select input, a clock input and a data output, the scan flip-flops being serially coupled together such that the scan data input of a first flip-flop forms a serial data input for the testing circuit, the data output of a last flip-flop forms a serial data output for the testing circuit, the scan data input of each remaining flip-flop is connected to the data output of a previous flip-flop, the normal data input of at least one of the scan flip-flops forms an unload input, and the data select signal of at least one of the scan flip-flops forms a test enable signal which enables one of the serial data input and the unload input;
a Y number of latches which each have a data input, a clock input and a data output, each of the latches having its data input and its clock input connected to the data output and the data select input, respectively, of a different one of the scan flip-flops, the data output of at least one of the latches forming a load output;
an X number of input multiplexers which each have an input coupled to the load output and an output coupled to a different one of the X number of portions of circuitry; and
an output multiplexer having an output and an X number of inputs, the output being coupled to the unload input and each of the inputs being coupled to a different one of the X number of portions of circuitry.

12. A testing circuit in accordance with claim 11, further comprising:
a control circuit which, in response to data received in the serial data input, selects one of the input multiplexers to receive data from the load output and which selects one of the inputs of the output multiplexer to provide data to the unload input.

13. A testing circuit in accordance with claim 12, wherein at least one of the scan flip-flops and a corresponding latch provide data to the control circuit.

14. A testing circuit in accordance with claim 12, wherein the data output of at least one of the latches is coupled to the control circuit to provide data for selecting one of the input multiplexers, and the data output of at least another one of the latches is coupled to the control circuit to provide data for selecting one of the inputs of the output multiplexer.

15. A method of testing X number of portions of circuitry embedded within a larger circuit, comprising the steps of:
serially loading test data into a plurality of serially connected scan flip-flops;
latching a data output of each of the scan flip-flops;
loading the latched data in a parallel manner into one of an X number of input multiplexers which are each associated with one of the portions of circuitry;
loading output data from each of the portions of circuitry in a parallel manner into a different one of an X number of inputs of an output multiplexer; and
loading data from an output of the output multiplexer into the plurality of serially connected scan flip-flops in a parallel manner.

16. A method in accordance with claim 15, further comprising the step of:
selecting one of the X number of input multiplexers into which the latched data will be loaded.

17. A method in accordance with claim 15, further comprising the step of:
selecting one of the X number of inputs of the output multiplexer which will provide data to be loaded into the plurality of serially connected scan flip-flops in a parallel manner.

18. A method in accordance with claim 15, further comprising the step of:
serially unloading test data from the plurality of serially connected scan flip-flops.

* * * * *